(12) United States Patent
Watt

(10) Patent No.: US 7,098,717 B2
(45) Date of Patent: Aug. 29, 2006

(54) GATE TRIGGERED ESD CLAMP

(75) Inventor: Jeffrey Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/877,010

(22) Filed: Jun. 25, 2004

(65) Prior Publication Data

US 2005/0285657 A1    Dec. 29, 2005

(51) Int. Cl.
  *H03K 5/08* (2006.01)
  *H03L 5/00* (2006.01)
(52) U.S. Cl. .......................... 327/313; 361/56
(58) Field of Classification Search ............... 327/313; 361/56
  See application file for complete search history.

(56) References Cited

U.S. PATENT DOCUMENTS

| | | | |
|---|---|---|---|
| 5,825,600 A | 10/1998 | Watt | 361/56 |
| 6,034,552 A * | 3/2000 | Chang et al. | 326/83 |
| 6,118,640 A | 9/2000 | Kwong | 361/56 |
| 6,552,886 B1 * | 4/2003 | Wu et al. | 361/56 |
| 6,777,721 B1 | 8/2004 | Huang et al. | 257/111 |
| 6,794,715 B1 | 9/2004 | Liu et al. | 257/346 |
| 6,828,842 B1 * | 12/2004 | Saito et al. | 327/318 |
| 6,912,109 B1 * | 6/2005 | Ker et al. | 361/56 |

FOREIGN PATENT DOCUMENTS

WO    WO 03/081742 A1    10/2003

OTHER PUBLICATIONS

A. Chatterjee and T. Polgreen, "A low-voltage triggering SCR for on-chip ESD protection at output and input pads," IEEE Electron Device Lett., vol. 12, pp. 21-22 (Jan. 1991).
A. Amerasekera and C. Duvvury, ESD in Silicon Integrated Circuits, pp. 28-40, 300-304, 95-98, 282-284, and 175-179 (Wiley, 2d ed. 2002).
R. Merrill and E. Issaq, "ESD Design Methodology" in Proc. EOS/ESD Symp., pp. 233-277 (1993).
K. G. Verhaege and C.C. Russ, "Wafer Cost Reduction Through Design of High Performance Fully Silicided ESD Devices" in Proc. EOS/ESD Symp., pp. 18-28 (2000).
Merrill R. et al.: "ESD Design Methodology" EOS/ESD Symposium 93 Conference Proceedings Article, Sep. 28, 1993, pp. 233-237, Xp010324698.
Wu C C et al.: A 90-nm CMOS device technology with high-speed, general-purpose, and low'leakage transistors for system on chip applications: International Electron Devices Meeting 2002. IEDM. Technical Digest. San Francisco, CA, Dec. 8-11, 2002, New York, NY: IEEE, NY, Dec. 8, 2002, pp. 65-68, ISBN: 0-7803-7462-2.

* cited by examiner

*Primary Examiner*—Quan Tra
(74) *Attorney, Agent, or Firm*—Morgan, Lewis & Bockius LLP

(57) ABSTRACT

The clamp circuit of the present invention comprises a low voltage, thin oxide MOS transistor and a trigger element comprising a timing element and at least one inverter. The source and drain of the MOS transistor are connected between a first node and a second node. The timing element comprises a capacitive element and a resistive element connected between the first and second nodes. The inverter is connected between a third node between the capacitive element and the resistive element and the gate of the MOS transistor. Advantageously, one or both of the capacitive element and the resistive element is also implemented in low voltage, thin oxide MOS transistors.

10 Claims, 7 Drawing Sheets

GATE TRIGGERED ESD CLAMP

BACKGROUND OF THE INVENTION

A grounded gate NMOS transistor 10 shown in FIG. 1 is commonly used as a power supply electrostatic discharge (ESD) clamp. NMOS transistor 10 comprises a gate 20, a source 30, and a drain 40. Gate 20 and source 30 are coupled together and connected to ground, Vss. Drain 40 is normally connected to a power supply voltage, Vcc. This device provides ESD protection by switching to the low-impedance "snapback" regime when a large enough voltage appears between Vcc and Vss to cause the drain junction to break down.

The NMOS device is usually implemented as a multi-finger transistor. FIG. 2 shows a layout style used with a self-aligned silicide (salicide) process to provide acceptable ESD performance. The layout of FIG. 2 comprises a gate 120, source diffusions 130, source leads 135, drain diffusions 140, and drain leads 145. Following known practice, the source and drain diffusions 130, 140 are clad in a metal silicide (not shown) to reduce the contact resistance. See, e.g., A. Amerasekera and C. Duvvury, *ESD in Silicon Integrated Circuits*, pp. 300–304 (Wiley, 2d ed. 2002). The source leads 135 are connected to the source diffusions by contacts 137; and the drain leads 145 are connected to the drain diffusions 140 by contacts 147. A guard ring 160 surrounds the NMOS transistor and is connected to ground, Vss, by leads 165 and contacts 167.

In the example of FIG. 2, gate 120 comprises four polysilicon fingers, but in general the number of fingers may be varied to meet the total transistor width required to achieve the ESD goals. For a grounded gate NMOS ESD power clamp, the gate fingers are connected to Vss directly or through a resistor. The NMOS layout uses a silicide block mask to produce an unsilicided diffusion region between the source/drain contacts and the gate. The unsilicided region has higher resistance than the silicide and acts as a ballast resistance to produce uniform current flow through all legs of the transistor. A large spacing between the source/drain contacts 137, 147 and gate 120 is required to achieve a large enough resistance to provide acceptable ESD performance. This large spacing, however, leads to a large layout area for this structure. Without the ballast resistance, the current during an ESD event tends to flow through only one or a small number of fingers leading to low failure voltage See, A. Amerasekera and C. Duvvury, *ESD in Silicon Integrated Circuits*, pp. 96, 283. (Wiley, 2d ed. 2002). The ballast resistance can also be implemented using a back-end ballast approach as described in K. G. Verhaege and C. C. Russ, "Wafer Cost Reduction Through Design of High Performance Fully Silicided ESD Devices," in *Proc. EOS/ESD Symp.*, pp. 18–28 (2000) which leads to a more area efficient layout.

A known alternative to the grounded gate NMOS device which avoids the drain junction breakdown and snapback mode of operation is shown in FIG. 3. In this alternative, circuit 300 comprises an NMOS transistor 310 having a gate 320, a source 330 and a drain 340, a timing circuit 370 comprising a capacitor 372 and a resistor 374 connected in series at a node 376 and one or more series connected inverters 380 connected between node 376 and gate 320. Timing circuit 370 and inverters 380 constitute a trigger circuit for NMOS transistor 310. The number of inverters 380 and the position of capacitor 372 and resistor 374 are chosen so that the voltage at the output of the inverters causes transistor 310 to be off during normal operation. Thus, where transistor 310 is an NMOS transistor and the number of inverters is odd as shown in FIG. 3, source 330 and the other end of capacitor 372 are connected to ground, Vss, and drain 340 and the other end of the resistor 374 are connected to Vcc. For an even number of inverters 380, the positions of capacitor 372 and resistor 374 are exchanged so that the capacitor is connected to Vcc and the resistor to ground. See, R. Merrill and E. Issaq, "ESD Design Methodology," in *Proc. EOS/ESD Symp.*, pp. 233–277 (1993); A. Amerasekera and D. Duvvury, *ESD in Silicon Integrated Circuits*, p. 178 (Wiley, 2d ed. 2002).

The NMOS transistor 310 is wide enough to handle the ESD current in the normal mode of operation with Vd=Vg. Gate 320 is held at 0V during normal operation, and is driven to Vcc when a fast ramp is detected on Vcc. The NMOS transistor does not need to use any special layout since it is operating in the normal mode. However, the width of the gate needs to be much larger than the width for a grounded gate NMOS clamp to allow the transistor to operate in the normal mode. For example, W/L=8000/0.8 for a 0.8 um technology.

The problems with the grounded gate NMOS ESD power clamp such as that shown in FIGS. 1 and 2 are:

a) The large space between the source and drain contacts and the gate results in a large structure area for the silicide block layout approach.

b) It is difficult to guarantee that the ESD power clamp will turn on before other devices connected between Vcc and Vss are damaged.

c) The above problem is exacerbated when the capacitance between Vcc and Vss is small. This leads to a very fast ramp rate of the voltage between Vcc and Vss during an ESD event.

The problems with the non-breakdown alternative shown in FIG. 3 are:

a) The width of the NMOS device must be very large to keep the transistor away from the snapback region.

b) The trigger circuit must be tuned to work for a relatively narrow range of ESD voltage ramp rates on the Vcc bus. Since the ESD voltage ramp rate is dependent on the total capacitance between Vcc and Vss, it may not be possible to guarantee that the structure will work for any possible capacitance.

c) For a large enough capacitance between Vcc and Vss, the ramp rate of the voltage on Vcc during an ESD event may be the same or slower than the ramp rate when the circuit is being powered up during normal operation. In this case, it is impossible for the trigger circuit shown in FIG. 3 to distinguish between a normal power-up ramp and an ESD ramp which could increase to a large enough voltage to damage devices between Vcc and Vss without the ESD clamp ever turning on.

SUMMARY OF INVENTION

An illustrative embodiment of the clamp circuit of the present invention comprises a low voltage, thin oxide MOS transistor and a trigger element comprising a timing element and at least one inverter. The source and drain of the MOS transistor are connected between a first node and a second node. The timing element comprises a capacitive element and a resistive element connected between the first and second nodes. The inverter is connected between the gate of the MOS transistor and a third node between the capacitive element and the resistive element. Advantageously, one or both of the capacitive element and the resistive element is also implemented in low voltage, thin oxide MOS transistors.

DETAILED DESCRIPTION OF PREFERRED EMBODIMENT

Figure 1:
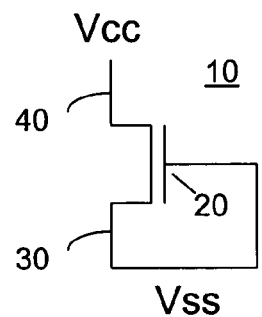
FIG. 1 is a schematic of a prior art power supply ESD clamp.
Figure 2:
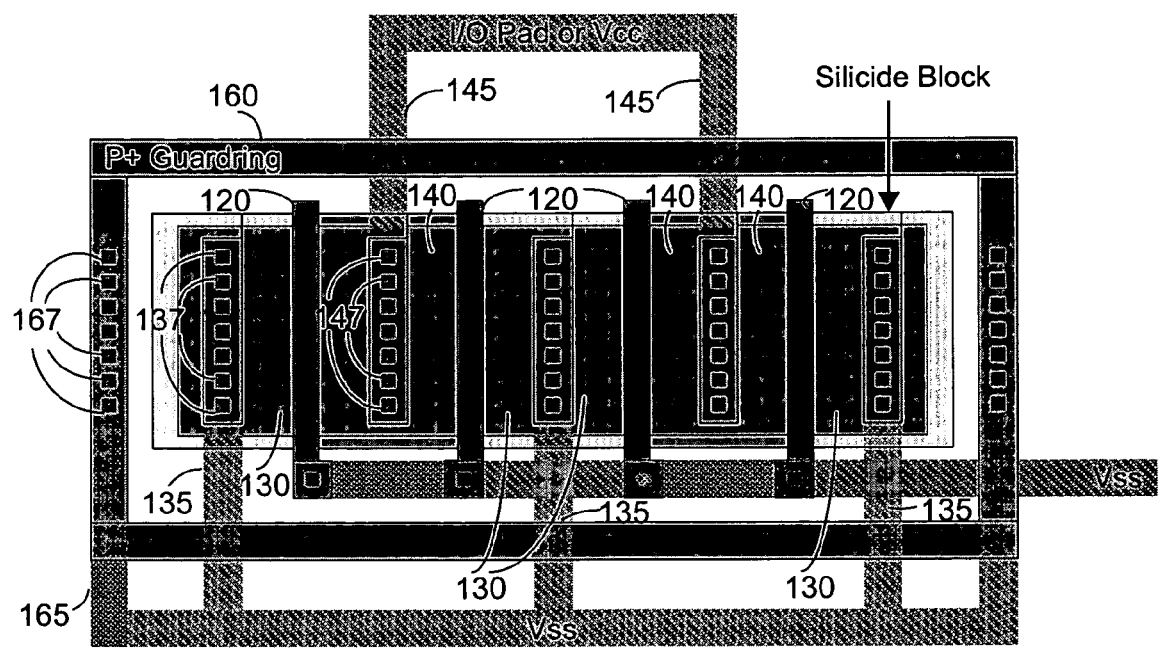
FIG. 2 is a layout for the ESD clamp of FIG. 1.
Figure 3:
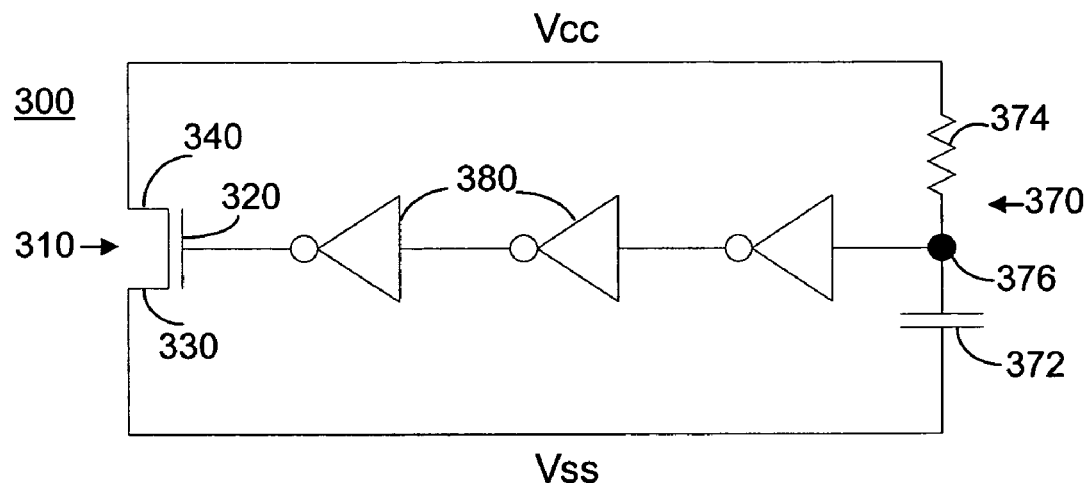
FIG. 3 is a circuit schematic of an alternative prior art power supply ESD clamp.

The invention uses a non-breakdown approach to solve the problems with prior art devices. In a preferred embodiment of the invention shown in FIG. 4, circuit 400 uses a low-voltage, thin oxide transistor 410 for the main power clamp to achieve much better area efficiency and thin low-voltage, oxide transistors 420 and 430 to provide the capacitive and resistive elements in a timing circuit for a trigger circuit. This arrangement enables triggering in response to both fast and slow voltage ramps. More specifically, circuit 400 comprises first, second and third thin oxide transistors 410, 420, 430, each having a gate 412, 422, 432 a source 414, 424, 434, and a drain 416, 426, 436. The source and drain of transistor 410 are connected between a first node and a second node. Illustratively, the first node is at Vcc, which is the power supply voltage, and the second node is at Vss, which is ground. The source 424 and drain 426 of transistor 420 are connected together so that transistor 420 forms a two-terminal capacitor. One terminal of the capacitor is connected at a third node 440 to either the source 434 or drain 436 of the third transistor 430. The other terminal of the capacitor and the other of the source and drain of the third transistor are connected between the first node and the second node. The gate 432 of the third transistor is connected to whichever of the first node and the second node causes the transistor to conduct. In the circuit shown in FIG. 4 where the third transistor is an NMOS transistor and the first node is at a higher potential than the second node, the gate 432 is connected to the first node.

Figure 4:
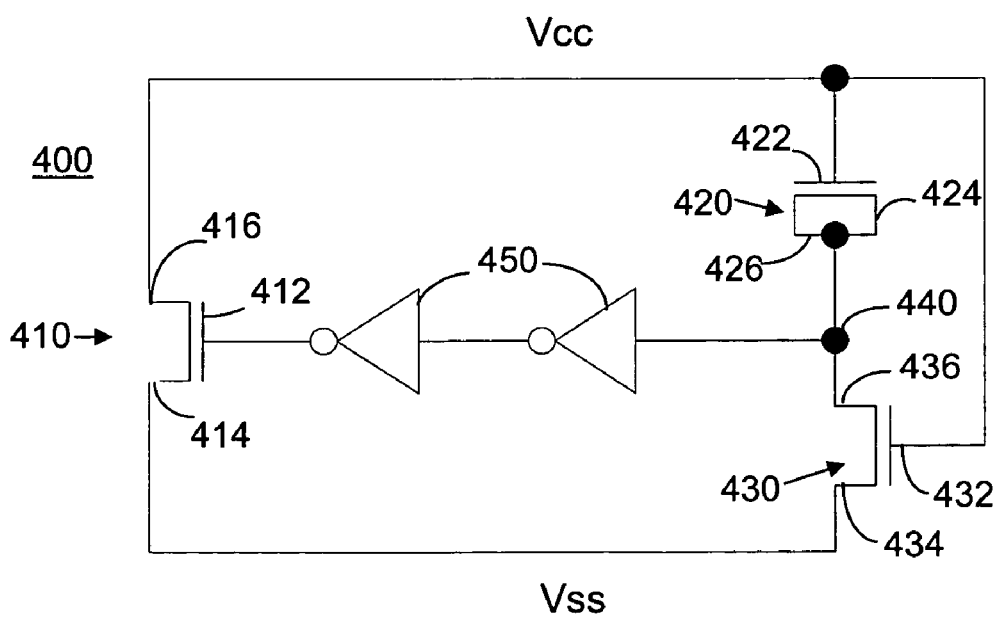
FIG. 4 is a circuit schematic of a first embodiment of the invention.

One or more inverters 450 is connected in series between the third node and the gate 412 of the first transistor. The number of inverters 450 and the position of transistors 420 and 430 are chosen so that the voltage at the output of the inverters causes transistor 410 to be off during normal operation. Thus, where the voltage at the first node is higher than that at the second node, the first transistor is an NMOS transistor, and transistor 420 is connected between the first node and the third node while transistor 430 is connected between the second node and the third node as shown in FIG. 4, an even number of inverters is connected in series between the third node and gate 412. As a result, during normal operation, transistor 430 keeps third node 440 at approximately the voltage of the second node and the output of the inverters is approximately the voltage of the third node and transistor 410 is off. Where transistor 420 is connected between the second node and the third node while transistor 430 is connected between the first node and the third node, an odd number of inverters is connected in series between the third node and gate 412. As a result, during normal operation, transistor 430 keeps third node 440 at approximately the voltage of the first node and the output of the inverters is approximately the voltage of the second node and transistor 410 is off.

The design of the structure shown in FIG. 4 is based on the thin oxide 1.0V transistors in the TSMC 90 nm generic process. Further details of the TSMC 90 nm process are set forth in C. C. Wu et al., "A 90-nm CMOS Device Technology with High-speed, General-purpose, and Low Leakage Transistors for System on Chip Applications, "Electron Devices Meeting, 2002, IEDM, pp. 65–68 (December 2002), a copy of which is incorporated by reference herein. As stated therein, the process supports high voltage I/O devices using 70, 50, and 28 Angstrom gate oxide for 33V, 25V and 1.5–1.8V interfaces, respectively.

Figure 5:
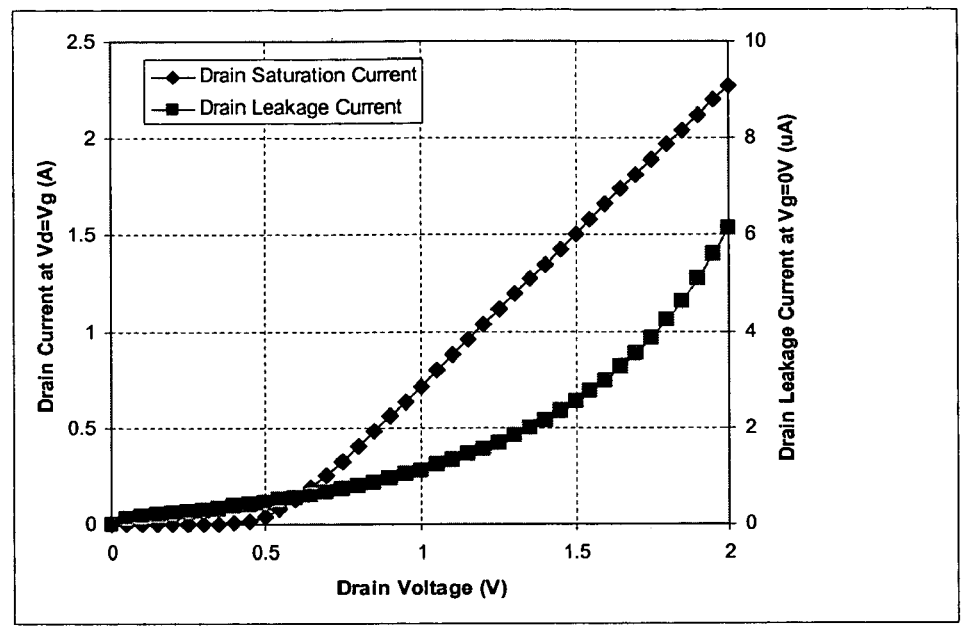
FIG. 5 is a plot of IV characteristics of a specific embodiment of the circuit schematic of FIG. 4.

The high threshold voltage device option and 10% larger than minimum gate length for transistor 410 are used to limit leakage current. The IV characteristics of transistor 410 are shown in FIG. 5 for a W/L=1500/0.11 NMOS transistor at room temperature. The transistor is assumed to have 50 gate fingers, each with a width of 30 um. Both the on current at Vg=Vd and the off current with Vg=0 as a function of drain voltage (Vcc) are shown. Due to the very low on resistance of this transistor, a total width of 1500 um can sink 1.35A of current at only 1.27V. This is the peak current expected for a 2000V human body model (HBM) ESD event. The leakage current for the 1500 um wide NMOS transistor is only 1 uA at 1.2V. Assuming minimum design rules are used for the layout of transistor 410, the active area would be 30 um by 19 um which is competitive with the area which would be required for a conventional grounded gate NMOS clamp The trigger circuit comprising NMOS transistors 420, 430 and inverters 450 is designed to respond to both fast ramp and dc voltage levels to ensure that transistor 410 is turned on regardless of the total capacitance between the first and second nodes. During normal operation with constant voltage at the first node, transistor 430 keeps third node 440 at the voltage of the second node which keeps the output of the inverters and the input to gate 412 at the voltage of the second node and the ESD clamp transistor 410 off. For a fast voltage ramp on the first node, the voltage is coupled to the third node 440 by the transistor 420. As a result, the voltage at the output of the inverters rises and turns on transistor 410. The voltage at node 440 is pulled back to that of the second node by transistor 430 in a time determined by the RC time constant of transistors 420 and 430. The time constant can be adjusted to be small enough that the trigger circuit will not respond to a normal ramp on the first node during power-up under absolute worst-case conditions.

Figure 6:
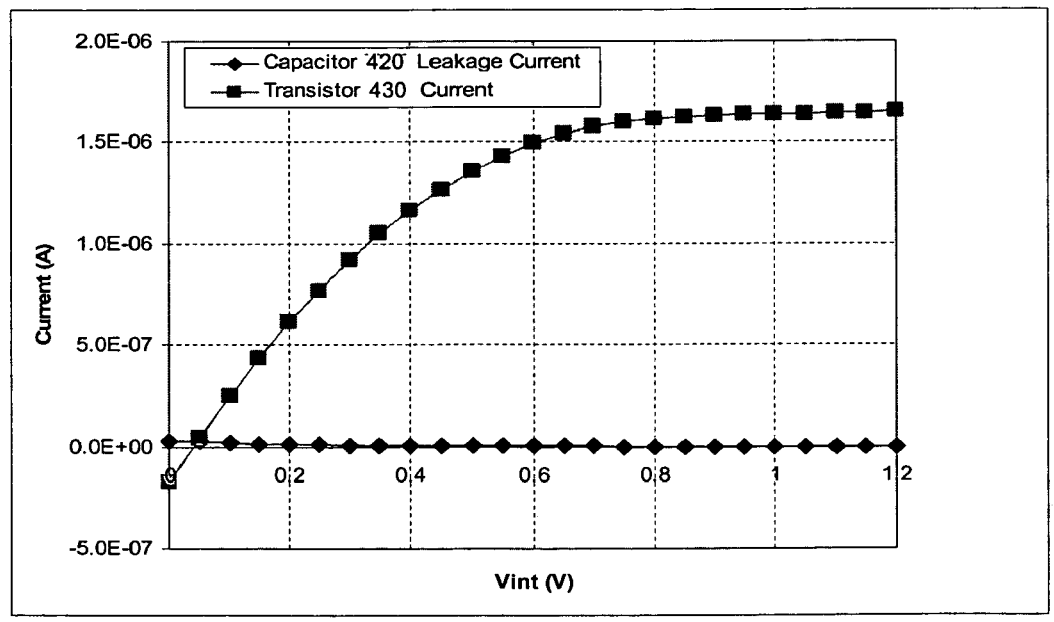
FIGS. 6 and 7 are IV plots for certain elements of FIG. 4 at different Vcc levels.
Figure 7:
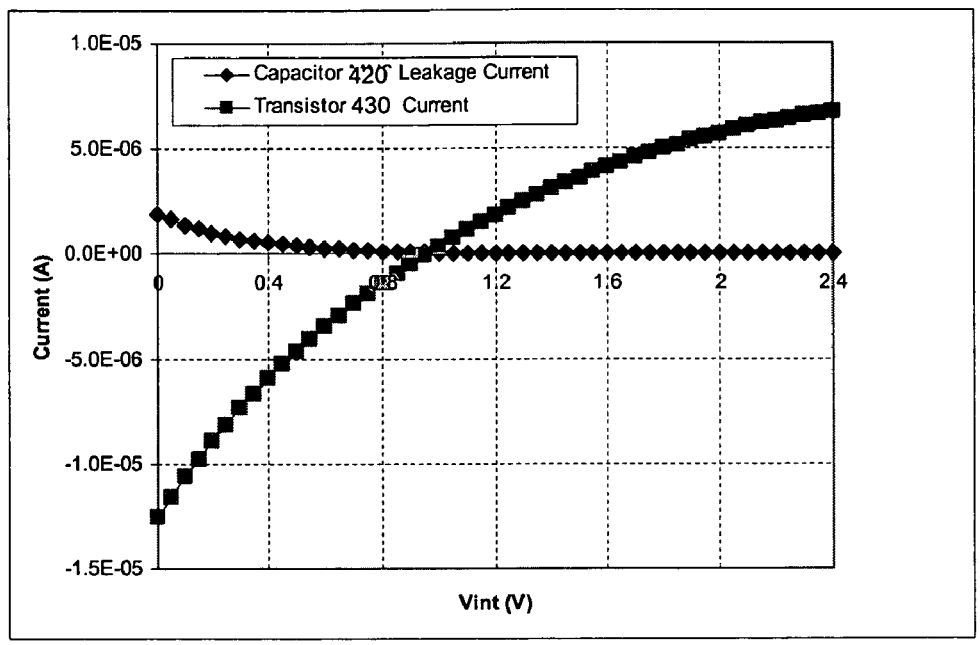
Figure 8:
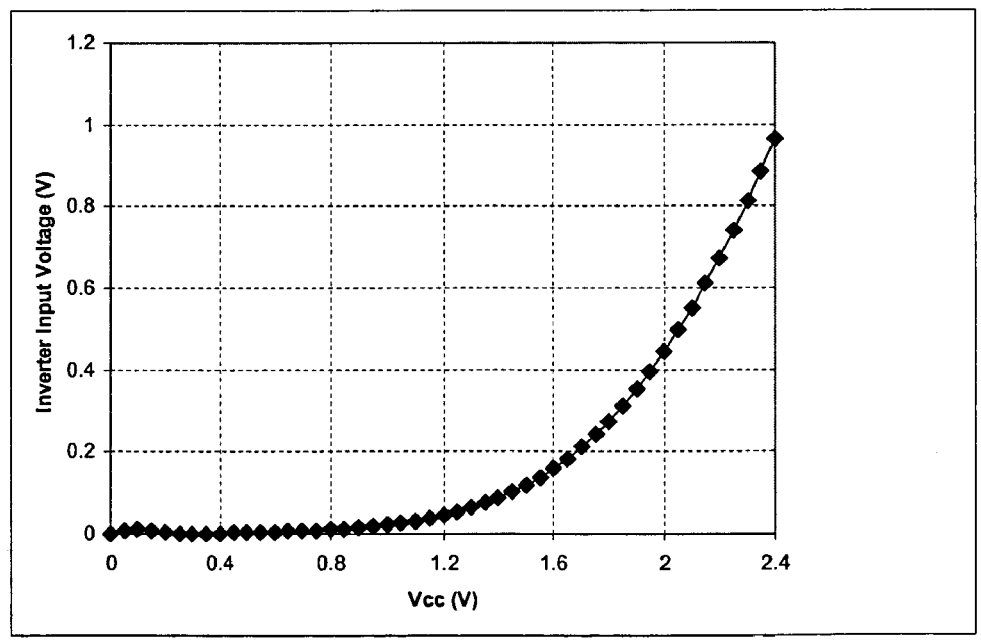
FIG. 8 is a plot of inverter input voltage versus Vcc.

The use of thin oxide devices for transistors 420 and 430 enables an additional dc triggering mechanism based on the gate tunneling current. This is illustrated in FIG. 6 and FIG. 7 which show the currents flowing through transistors 420 and 430 as a function of the intermediate voltage in between them (Vint) with Vcc=1.2V and Vcc=2.4V. At Vcc=1.2V, the gate leakage current is relatively small compared to the on-state channel current flowing through transistor 430. This causes the intermediate voltage at node 440 between transistors 420 and 430 to be close to Vss, the output of the first inverter to be Vcc and the output of the second inverter to be Vss. At Vcc=2.4V the gate leakage flowing into transistor 430 is comparable to the channel current and the intermediate voltage rises to about 0.95V. This is above the switching point of the first inverter which causes the output of the first inverter to be Vss and the output of the second inverter to be Vcc. The voltage at the third node 440 is shown as a function of Vcc in FIG. 8. The switching point of the first inverter is approximately 0.3Vcc which results in a dc trigger voltage of 2.2V.

Figure 9:
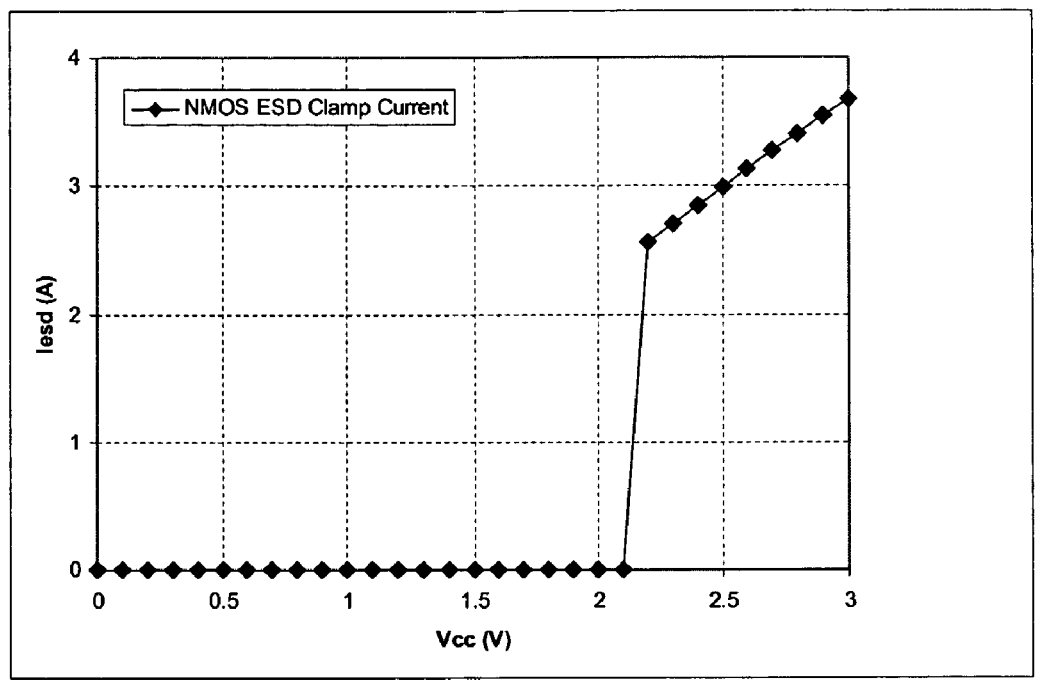
FIG. 9 is a plot of the DC characteristics of the circuit of FIG. 4.

The dc IV characteristics of the entire circuit of FIG. 4 are shown in FIG. 9. The NMOS clamp turns on at 2.2V with a very abrupt increase in current from <1 mA to >2.5 A. The IV characteristics are identical for positive and negative voltage sweeps.

Figure 10:
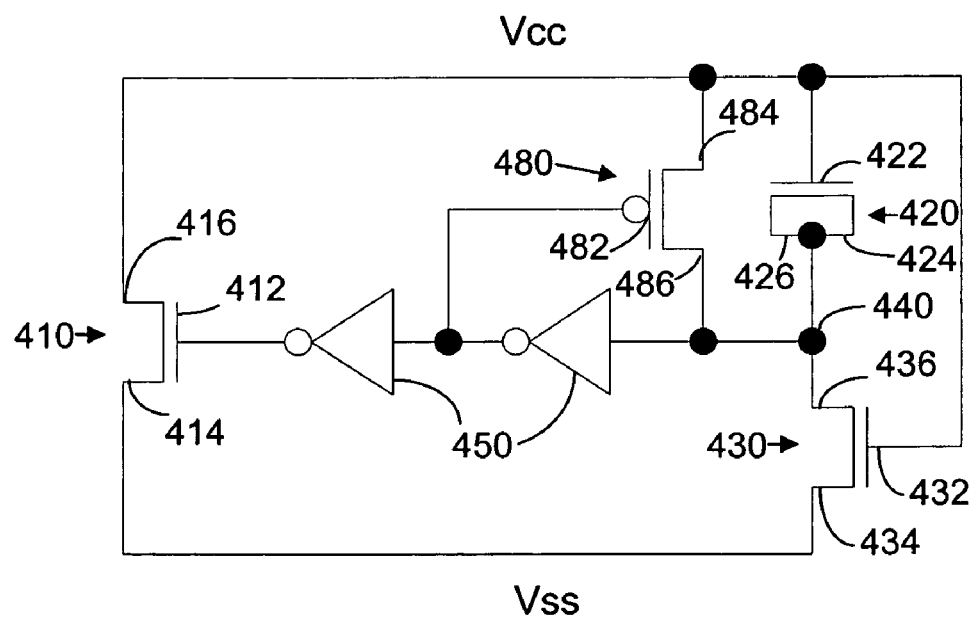
FIG. 10 is a circuit schematic of a second embodiment of the invention.
Figure 11:
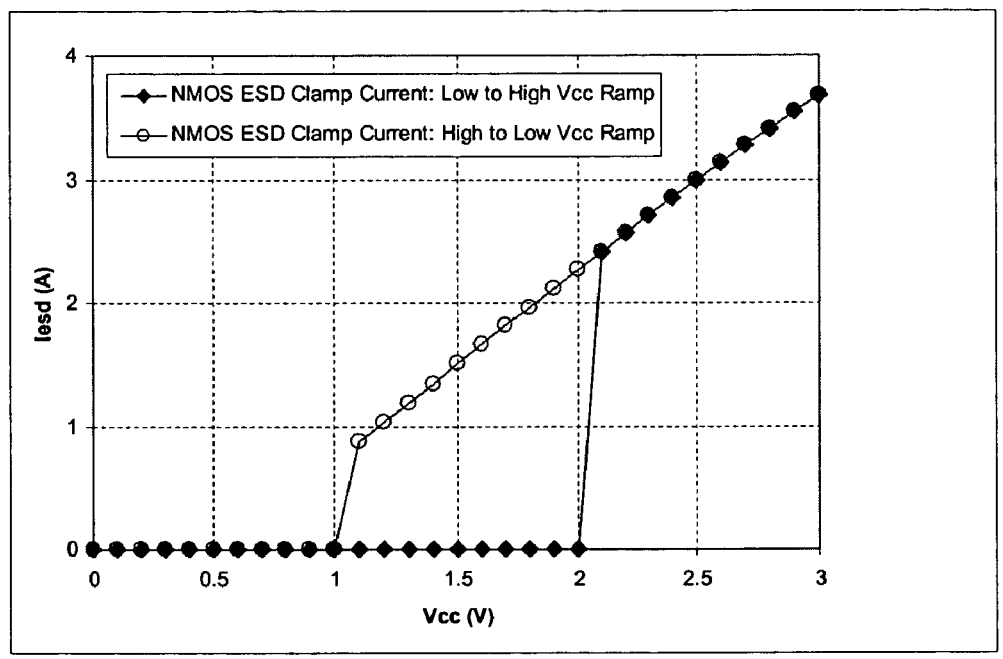
FIG. 11 is a plot of the IV characteristics of the circuit of FIG. 10.

An enhancement to the invention is shown in FIG. 10. Except for the addition of a PMOS transistor 480, the circuit is the same as that of FIG. 4 and the identical elements of FIG. 10 have accordingly been numbered the same. PMOS transistor 480 has a gate 482, a source 484 and a drain 486. The source 484 and drain 486 are connected between the first node and third node 440 and gate 482 is connected to the output of an odd number of inverters. As a result, the voltage at the gate of transistor 480 will be the inverse of the voltage at third node 440. Thus, when third node 440 is at a low voltage relative to the first node, PMOS transistor 480 will be off and when the third node is at a high voltage, the output of the odd-numbered transistors will be low causing PMOS transistor 480 to be on. The addition of PMOS transistor 480 creates hysteresis in the dc IV characteristics as shown in FIG. 11. As Vcc increases during an ESD event, the clamp will trigger into the on state at 2.1V. As Vcc decreases during the discharge of the ESD current, the capacitor element 430 is shunted by PMOS transistor 480 with the result that the voltage at the third node 440 remains high and the clamp remains on until Vcc drops to 1.1V.

Figure 12:
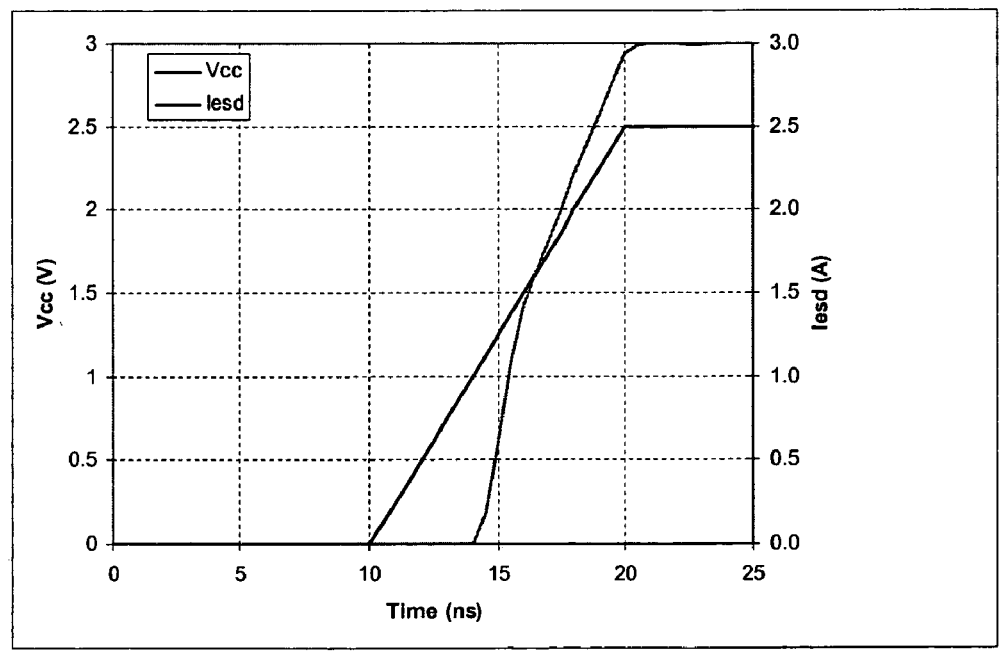
FIG. 12 is a plot of the response of the circuit of FIG. 10 to a fast voltage ramp during an ESD event.
Figure 13:
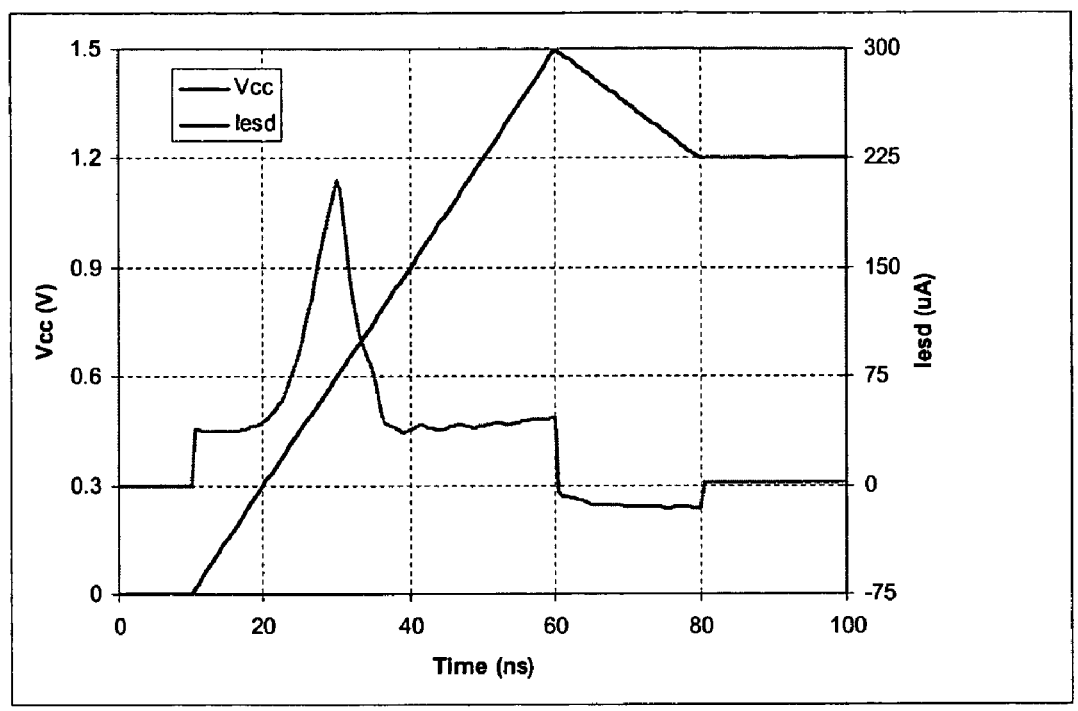
FIG. 13 is a plot of the response of the circuit of FIG. 10 to a fast voltage ramp during normal operation.

The correct operation of the ESD power clamp has been verified for voltage transients expected during both ESD events and normal operation. FIG. 12 is a plot of Vcc (v) versus time and $I_{esd}$ (A) versus time during an ESD event; and FIG. 13 is a plot of Vcc (v) versus time and $I_{esd}$ (μA) versus time during normal operation. During an ESD event, a fast voltage ramp on Vcc will trigger the ESD power clamp into the on state at Vcc=1.0V as shown in FIG. 12. However, for a fast voltage ramp on Vcc during normal operation, the ESD clamp does not turn on as shown in FIG. 13.

The invention provides a number of advantages over the prior art:
a) Operation of the NMOS ESD clamp in a non-breakdown or non-snapback mode eliminates the need for ballasting resistance which leads to a competitive layout area despite the need for a much larger total transistor width than a grounded gate NMOS approach.
b) The use of thin oxide transistors enables a much smaller structure than previously published for non-breakdown NMOS power clamps.
c) The use of gate tunneling current in the trigger circuit enables the clamp to respond to both fast and slow ESD voltage ramps. This enables more flexibility in the trigger circuit design to ensure that the clamp will turn on during an ESD event but not during normal operation.
d) The addition of hysteresis enables the clamp to stay in the on state to discharge the ESD current after it is triggered even when the voltage drops below the initial trigger voltage.
e) The power clamp structure does not operate in breakdown or snapback mode which allows it to be simulated with SPICE using normal device models. This greatly simplifies the design and verification of the structure.

As will be apparent to those skilled in the art, numerous variations of the embodiments described above may be implemented within the spirit and scope of the invention. For example, the invention may also be practiced using PMOS transistors where NMOS transistors are shown in the circuits of FIGS. 4 and 10 and an NMOS transistor in place of the PMOS transistor of FIG. 10. In such case, the number of inverters should be changed from odd to even or vice versa or the position of transistors 420 and 430 exchanged so that the voltage at the output of the inverters is such that transistor 410 is off during normal operation.

What is claimed is:

1. A clamp circuit comprising:
a first low voltage, thin oxide NMOS transistor having a source, a drain and a gate, said source and drain being connected between a first node and a second node,
a trigger circuit comprising a timing element and an even number of series-connected inverters connected to the gate of the first NMOS transistor, the timing element comprising a capacitive element and a resistive element connected in series between the first node and the second node, an input to the inverters being connected to a third node to which the capacitive element and the resistive element are connected, the capacitive element being connected between the first node and the third node, and
an additional MOS transistor having a source, a drain and a gate in which the source and drain are connected across the capacitive element, and the gate is connected to an output from an odd number of series-connected inverters.

2. The clamp circuit of claim 1 wherein the capacitive element is a second low voltage, thin oxide MOS transistor having a source, a drain and a gate in which the source and drain are connected together.

3. The clamp circuit of claim 2 wherein the resistive element is a third low voltage, thin oxide MOS transistor having a source, a drain and a gate in which the gate is connected to the power supply.

4. The clamp circuit of claim 1 wherein the resistive element is a third low voltage, thin oxide MOS transistor having a source, a drain and a gate in which the gate is connected to the power supply.

5. The clamp circuit of claim 1 wherein the additional MOS transistor is a PMOS transistor.

6. A clamp circuit comprising:
a first low, thin oxide NMOS transistor having a source, a drain and a gate, said source and drain being connected between a first node and a second node, a trigger circuit comprising a timing element and an odd number of series connected inverters connected to the gate of the first NMOS transistor, the timing element comprising a capacitive element and a resistive element connected in series between the first node and the second node, an input to the inverters being connected to a third node to which the capacitive element and the resistive element are connected, the capacitive element being connected between the second node and the third node, and an additional MOS transistor having a source, a drain and a gate in which the source and drain are connected across the capacitive element, and the gate is connected to an output from an odd number of series-connected inverters.

7. The clamp circuit of claim 6 wherein the additional MOS transistor is a NMOS transistor.

8. The clamp circuit of claim 1 wherein the first node is at a voltage higher than that of the second node.

9. The clamp circuit of claim 6 wherein the capacitive element is a second low voltage, thin oxide MOS transistor having a source, a drain and a gate in which the source and drain are connected together.

10. The clamp circuit of claim 6 wherein the resistive element is a third low voltage, thin oxide MOS transistor having its gate connected to the power supply.

* * * * *